United States Patent
You

(10) Patent No.: US 7,259,997 B2
(45) Date of Patent: Aug. 21, 2007

(54) FLASH MEMORY DEVICE WITH REDUCED ACCESS TIME

(75) Inventor: Byoung Sung You, Jecheon-si (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 110 days.

(21) Appl. No.: 11/306,071

(22) Filed: Dec. 15, 2005

(65) Prior Publication Data

US 2006/0242488 A1 Oct. 26, 2006

(30) Foreign Application Priority Data

Apr. 11, 2005 (KR) .................... 10-2005-0030053

(51) Int. Cl.
*G11C 11/34* (2006.01)
(52) U.S. Cl. .................... 365/185.33; 365/185.09; 365/191
(58) Field of Classification Search ........... 365/185.33, 365/185.09, 191, 189.04, 189.12
See application file for complete search history.

(56) References Cited

U.S. PATENT DOCUMENTS 5,606,532 A * 2/1997 Lambrache et al. ..... 365/238.5
6,101,624 A * 8/2000 Cheng et al. ............ 714/736
2002/0184585 A1 12/2002 Wadley ..................... 714/727

FOREIGN PATENT DOCUMENTS

| JP | 2001-175586 | 6/2001 |
| JP | 2002-140900 | 5/2002 |
| KR | 2000-0075258 A | 12/2000 |
| KR | 1999-0066892 A | 7/2001 |

* cited by examiner

*Primary Examiner*—Van Thu Nguyen
*Assistant Examiner*—Dang Nguyen
(74) *Attorney, Agent, or Firm*—Marshall, Gerstein & Borun LLP

(57) ABSTRACT

A flash memory device with a reduced access time. The flash memory device executes an error detection and correction operation while encoding or decoding transmission and reception signals with a host apparatus. The flash memory device utilizes a simplified design algorithm and reduces an access time.

15 Claims, 3 Drawing Sheets

FLASH MEMORY DEVICE WITH REDUCED ACCESS TIME

TECHNICAL FIELD

This patent relates to semiconductor devices, and more particularly, to flash memory devices.

DISCUSSION OF RELATED ART

In general, in a system including a flash memory device, the flash memory device functions to store various data received from a host apparatus (or a control apparatus), read data requested by the host apparatus and transmit the read data to the host apparatus. For data transmission with the host, the flash memory device includes an encoding and decoding unit such as a finite state machine (FSM). A typical flash memory device including the FSM is shown in FIG. 1.

Referring to FIG. 1, the flash memory device 10 includes a host interface unit 11, a control logic unit 12, an internal register unit 13, a FSM 14, an Error Correction Code (ECC) unit 15 and a flash memory core 16.

The FSM 14 decodes a data signal (DAT) received from the control logic unit 12 and a command signal (CMD) and an address signal (ADD) received from the internal register unit 13. Furthermore, the FSM 14 encodes the data signal (DAT) received from the flash memory core 16. The ECC unit 15 checks and corrects error of encoded signals (DEC) or decoded signals (ENC) by the FSM 14. Thereafter, the FSM 14 stores data signals whose error is finally corrected in the flash memory core 16 or outputs the data signal to the control logic unit 12.

As described above, in the flash memory device 10, the internal register unit 13, the FSM 14 and the ECC unit 15 are separated from each other. Therefore, when they are designed by Very-High-speed integrated circuit Hardware Description Language (VHDL) or Velilong Hardware Description Language, a problem arises because an algorithm becomes complicated.

In addition, after the FSM 14 performs an encoding or decoding operation on the data signal (DAT), which are transmitted from the host apparatus 20 or read from the flash memory core 16, the ECC unit 15 can detect or correct error of the encoded or decoded signals (ENC or DEC) using the FSM 14. This results in an increased processing time. Therefore, from a viewpoint of the host apparatus 20, a problem arises because the performance of an overall system is lowered since the access time of the flash memory device 10 is increased.

SUMMARY OF THE INVENTION

A flash memory device utilizes a simplified design algorithm and reduces an access time by executing an error detection and correction operation while encoding or decoding transmission and reception signals with a host apparatus.

A flash memory device may include a FSM check unit and a flash memory core. The FSM check unit detects and corrects error of an input data signal, a command signal, a write address signal and a read address signal, while decoding any one of the signals, to output one of a decoded input data signal, a decoded command signal, a decoded write address signal and a decoded read address signal, and detects and corrects error of a read data signal, state information and chip information, while encoding one of the read data signal, the state information and the chip information, to output one of an encoded read data signal, encoded state information and encoded chip information. Furthermore, the flash memory core stores the decoded input data signal in response to the decoded command signal and the decoded write address signal, outputs the read data signal in response to the decoded command signal and the decoded read address signal, and outputs the state information and the chip information in response to a control signal.

DETAILED DESCRIPTION

Figure 1:
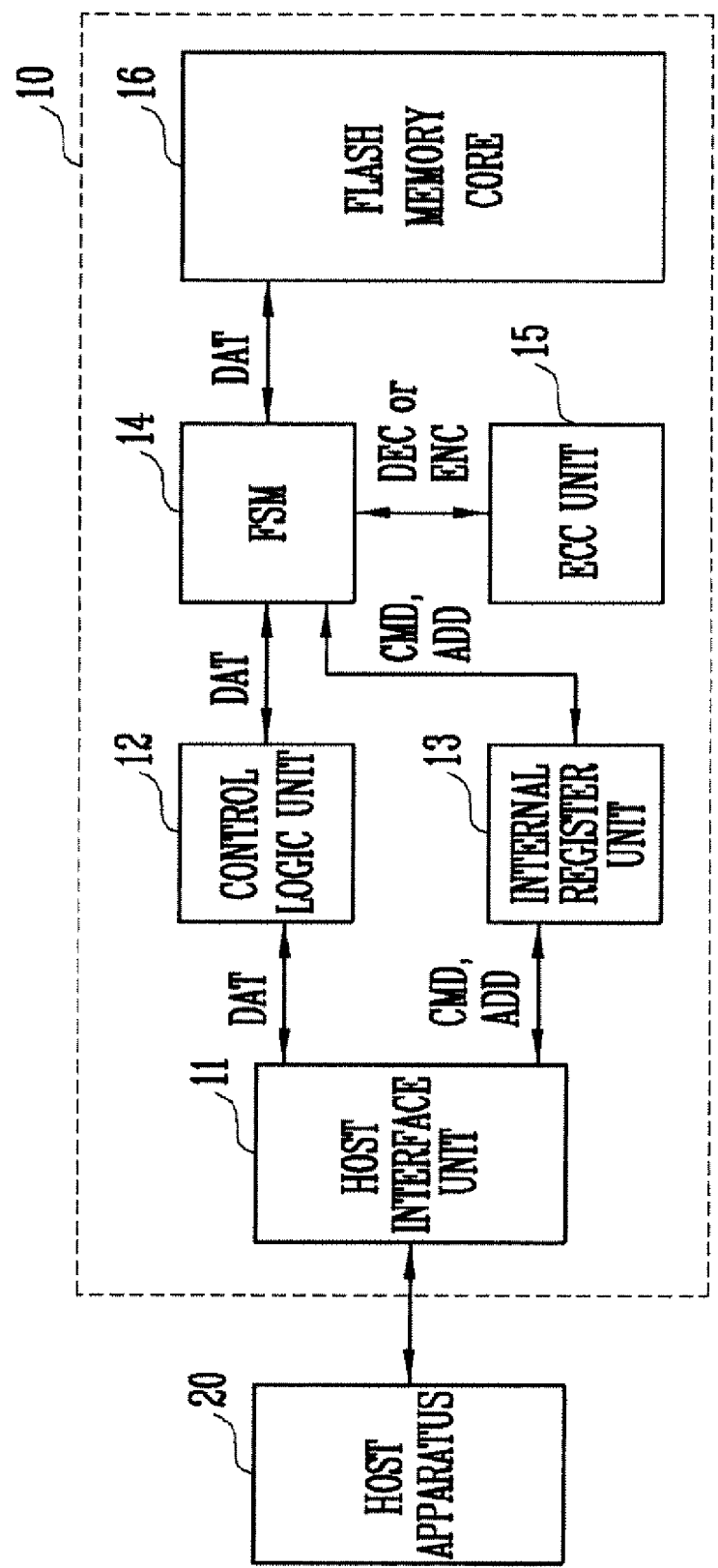
FIG. 1 is a schematic block diagram of a flash memory device in the related art.
Figure 2:
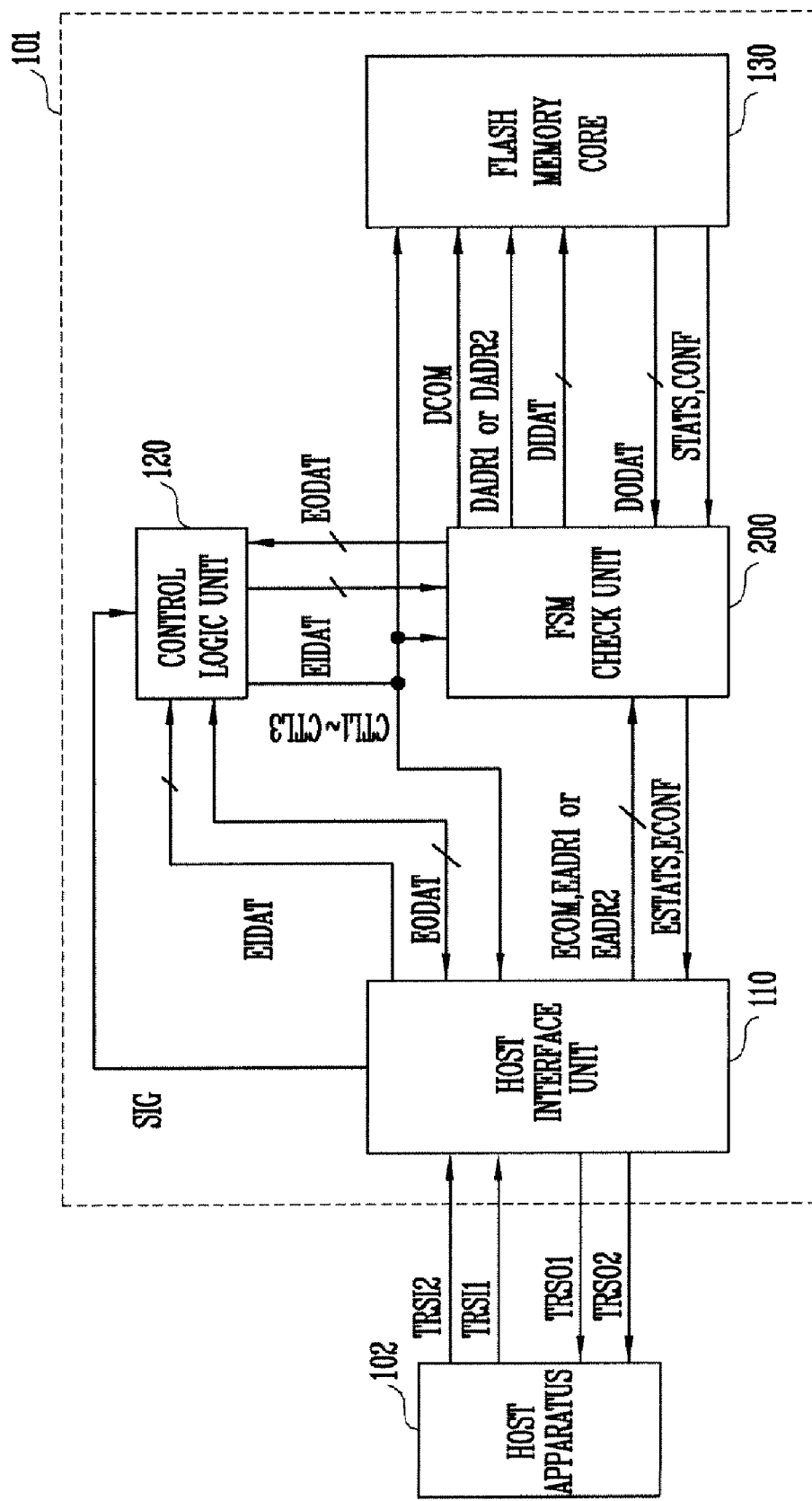
FIG. 2 is a block diagram of a flash memory device.

FIG. 2 is a block diagram of a flash memory device. Referring to FIG. 2, the flash memory device 101 may include a host interface unit 110, a control logic unit 120, a flash memory core 130 and a FSM check unit 200.

The host interface unit 110 interfaces the control logic unit 120 and the FSM check unit 200, and an external host apparatus 102. More particularly, the host interface unit 110 can extract a command signal (ECOM), an input data signal (EIDAT) and a write address signal (EADR1) or a command signal (ECOM) and a read address signal (EADR2) from a first transmission signal (TRSI1) received from the host apparatus 102. The command signal (ECOM) may include a program command or a read command. The host interface unit 110 outputs the input data signal (EIDAT) to the control logic unit 120 and outputs the command signal (ECOM) and the write or read address signal (EADR1 or EADR2) to the FSM check unit 200. Furthermore, the host interface unit 110 extracts a control information signal (SIG) from the second transmission signal (TRSI2) received from the host apparatus 102 and outputs it to the control logic unit 120. The host interface unit 110 converts an encoded read data signal (EODAT), which is received from the control logic unit 120, into a third transmission signal (TRSO2) and outputs the converted signal to the host apparatus 102. The host interface unit 110 converts encoded state information (ESTATS) and encoded chip information (ECONF), which are received from the FSM check unit 200, into a fourth transmission signal (TRSO2) and outputs the converted signal to the host apparatus 102.

The control logic unit 120 outputs the input data signal (EIDAT) to the FSM check unit 200 and outputs the encoded read data signal (EODAT), which is received from the FSM check unit 200, to the host interface unit 110. Furthermore, the control logic unit 120 generates control signals (CTL1 to CTL3) in response to the control information signal (SIG) and controls the host interface unit 110, the FSM check unit 200 and the flash memory core 130. More particularly, the control logic unit 120 outputs the control signal (CTL1) to the host interface unit 110, the control signal (CTL2) to the FSM check unit 200 and the control signal (CTL3) to the flash memory core 130, thus controlling the operation of each of the units.

The FSM check unit 200 decodes any one of the input data signal (EIDAT), the command signal (ECOM), the write address signal (EADR1) and the read address signal (EADR2), and at the same time, detects and corrects error of the signal. More particularly, when the FSM check unit 200 receives the input data signal (EIDAT), it detects and corrects error of the input data signal (EIDAT) while decoding the input data signal (EIDAT), and then outputs the decoded input data signal (DIDAT). In a similar way, when the FSM check unit 200 receives the command signal (ECOM), the write address signal (EADR1) and the read address signal (EADR2), it detects and corrects error of those signals while decoding them and then outputs the decoded command signal (DCOM) and the decoded write or read address signal (DADR1 or DADR2). The error detection and correction function of the FSM check unit 200 can be designed based on the Hamming code that can detect and correct error.

Furthermore, the FSM check unit 200 detects and corrects error of one of a read data signal (DODAT), state information (STATS) and chip information (CONF) while encoding the signal. The state information (STATS) can include information indicating a current operation state of the flash memory device 101. The chip information (CONF) can include specification information on the flash memory device 101. The state information (STATS) and the chip information (CONF) are stored in the flash memory core 130. The flash memory core 130 outputs the state information (STATS) and the chip information (CONF) to the FSM check unit 200 in response to the control signal (CTL3) received from the control logic unit 120.

The FSM check unit 200 detects and corrects error of the read data signal (DODAT) while encoding the signal when receiving the read data signal (DODAT), and then outputs the encoded read data signal (EODAT). Furthermore, the FSM check unit 200 detects and corrects error of the state information (STATS) and the chip information (CONF) while encoding them, and then outputs the encoded state information (ESTATS) and the encoded chip information (ECONF).

The flash memory core 130 stores the decoded input data signal (DIDAT) in response to the decoded command signal (DCOM) and the decoded write address signal (DADR1). Furthermore, the flash memory core 130 outputs the read data signal (DODAT) in response to the decoded command signal (DCOM) and the decoded read address signal (DADR2) and outputs the state information (STATS) and the chip information (CONF) in response to the control signal (CTL3).

Figure 3:
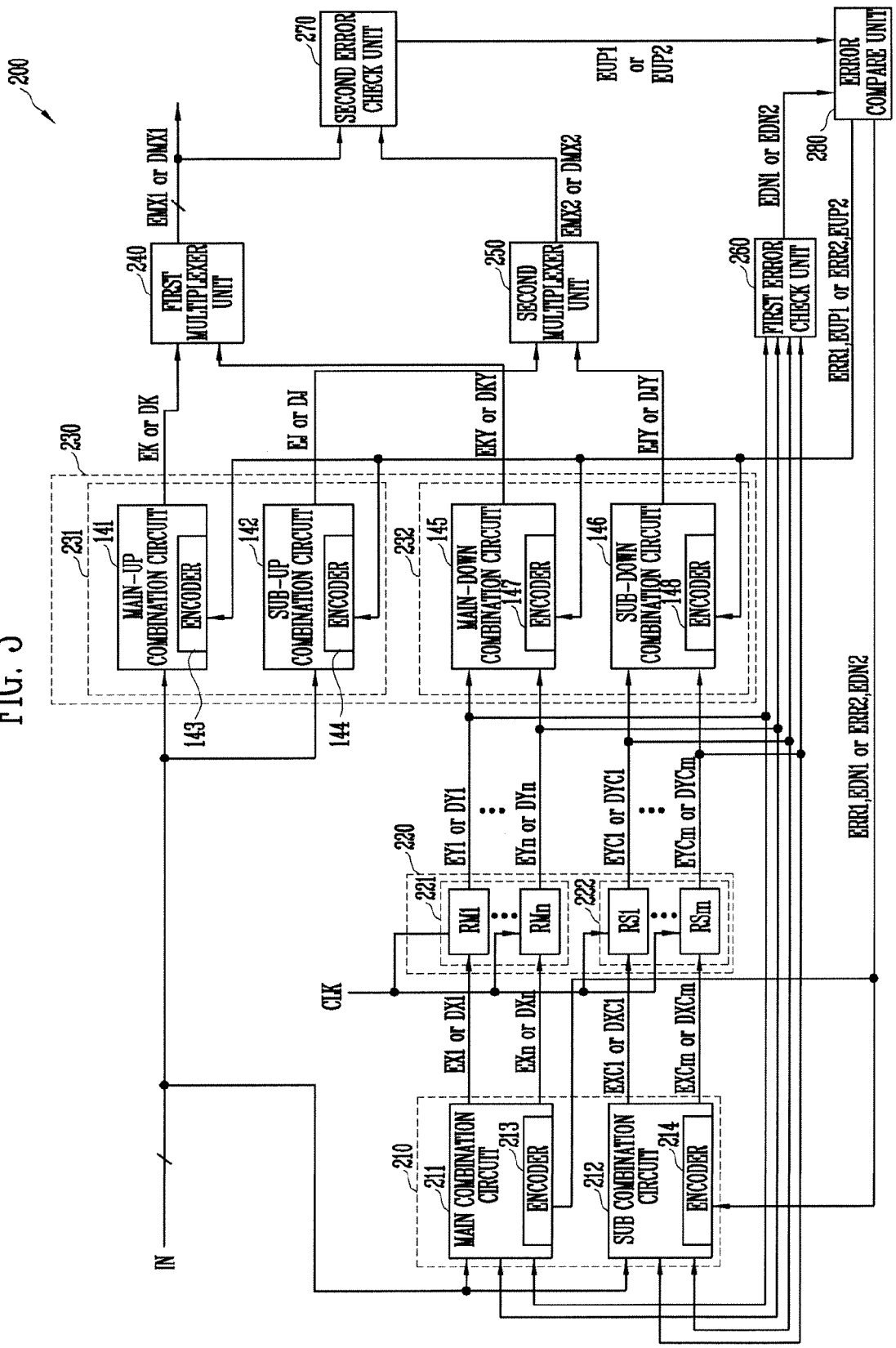
FIG. 3 is a detailed block diagram of a FSM check unit shown in FIG. 2.

FIG. 3 is a detailed block diagram of the FSM check unit shown in FIG. 2. Referring to FIG. 3, the FSM check unit 200 may include a first combination circuit 210, a register circuit 220, a second combination circuit 230, a first multiplexer unit 240, a second multiplexer unit 250, a first error check unit 260, a second error check unit 270 and an error compare unit 280.

The first combination circuit 210 may include a main combination circuit 211 and a sub-combination circuit 212. The main combination circuit 211 may include an encoder 213. The main combination circuit 211 encodes or decodes an input signal (IN) and outputs first encoding signals (EX1 to EXn) (n is an integer) or first decoding signals (DX1 to DXn) (n is an integer). The input signal (IN) can be one of the command signal (ECOM), the write address signal (EADR1), the read address signal (EADR2) and the input data signal (EIDAT) or one of the read data signal (DODAT), the state information (STATS) and chip information (CONF).

The encoder 213 encodes first error detection and correction information (EDN1) along with the first encoding signals (EX1 to EXn) in response to a first error determination signal (ERR1) when the first error determination signal (ERR1) is enabled. As a result, the main combination circuit 211 outputs the first encoding signals (EX1 to EXn) including the first error detection and correction information (EDN1). Furthermore, the encoder 213 encodes second error detection and correction information (EDN2) along with the first decoding signals (DX1 to DXn) in response to a second error determination signal (ERR2) when the second error determination signal (ERR2) is enabled. As a result, the main combination circuit 211 outputs the first decoding signals (DX1 to DXn) including the second error detection and correction information (EDN2).

The sub-combination circuit 212 may also include an encoder 214. The sub-combination circuit 212 encodes or decodes the input signal (IN) and outputs second encoding signals (EXC1 to EXCm) (m is an integer) or second decoding signals (DXC1 to DXCm) (m is an integer). The encoder 214 encodes the first error detection and correction information (EDN1) along with the second encoding signals (EXC1 to EXCm) in response to the first error determination signal (ERR1). As a result, the sub-combination circuit 212 outputs the second encoding signals (EXC1 to EXCm) including the first error detection and correction information (EDN1). Furthermore, the encoder 214 encodes the second error detection and correction information (EDN2) along with the second decoding signals (DXC1 to DXCm) in response to the second error determination signal (ERR2) when the second error determination signal (ERR2) is enabled. As a result, the sub-combination circuit 212 outputs the second decoding signals (DXC1 to DXCm) including the second error detection and correction information (EDN2).

The register circuit 220 may include a first register unit 221 and a second register unit 222. The first register unit 221 may include a plurality of registers RM1 to RMn) (n is an integer). The plurality of registers RM1 to RMn) stores the first encoding signals (EX1 to EXn), respectively, in response to a clock signal (CLK), and outputs first storage signals (EY1 to EYn), respectively. Furthermore, the plurality of registers RM1 to RMn stores the first decoding signals (DX1 to DXn), respectively, in response to the clock signal (CLK) and outputs third storage signals (DY1 to DYn), respectively. The first storage signals (EY1 to EYn) are signals resulting from the first encoding signals (EX1 to EXn), which are delayed for a predetermined time by the plurality of registers RM1 to RMn), respectively. Furthermore, the third storage signals (DY1 to DYn) are signals resulting from the first decoding signals (DX1 to DXn), which are delayed for a predetermined time by the plurality of registers RM1 to RMn), respectively.

The second register unit 222 may include a plurality of registers RS1 to RSm) (m is an integer). The plurality of registers RS1 to RSm stores second encoding signals (EXC1 to EXCm), respectively, in response to the clock signal (CLK) and outputs second storage signals (EYC1 to EYCm). Furthermore, the plurality of registers RS1 to RSm stores second decoding signals (DXC1 to DXCm), respectively, in response to the clock signal (CLK) and outputs fourth storage signals (DYC1 to DYCm), respectively. The second storage signals (EYC1 to EYCm) are signals resulting from the second encoding signals (EXC1 to EXCm), which are delayed for a predetermined by the plurality of registers RS1 to RSm. Furthermore, the fourth storage signals (DYC1 to DYCm) are signals resulting from the second decoding signals (DXC1 to DXCm), which are delayed for a predetermined by the plurality of registers RS1 to RSm.

The second combination circuit 230 may include an up combination circuit unit 231 and a down combination circuit unit 232. The up combination circuit unit 231 includes a main-up combination circuit 141 and a sub-up combination circuit 142. The main-up combination circuit 141 includes an encoder 143. The main-up combination circuit 141 encodes or decodes the input signal (IN) and outputs a third encoding signal (EK) or a third decoding signal (DK).

The encoder 143 encodes third error detection and correction information (EUP1) along with a third encoding signal (EK) in response to the first error determination signal (ERR1) when the first error determination signal (ERR1) is enabled. As a result, the main-up combination circuit 141 outputs the third encoding signal (EK) including the third error detection and correction information (EUP1). Furthermore, the encoder 143 encodes fourth error detection and correction information (EUP2) along with the third decoding signal (DK) in response to the second error determination signal (ERR2) when the second error determination signal (ERR2) is enabled. As a result, the main-up combination circuit 141 outputs the third decoding signal (DK) including the fourth error detection and correction information (EUP2).

The sub-up combination circuit 142 may include an encoder 144. The sub-up combination circuit 142 encodes or decodes the input signal (IN) and outputs a fourth encoding signal (EJ) or a fourth decoding signal (DJ). The encoder 144 encodes the third error detection and correction information (EUP1) along with the fourth encoding signal (EJ) in response to the first error determination signal (ERR1) when the first error determination signal (ERR1) is enabled. As a result, the sub-up combination circuit 142 outputs the fourth encoding signal (EJ) including the third error detection and correction information (EUP1).

Furthermore, the encoder 144 encodes the fourth error detection and correction information (EUP2) along with the fourth decoding signal (DJ) in response to the second error determination signal (ERR2) when the second error determination signal (ERR2) is enabled. Consequently, the sub-up combination circuit 142 outputs the fourth decoding signal (DJ) including the fourth error detection and correction information (EUP2).

The down combination circuit unit 232 may include a main-down combination circuit 145 and a sub-down combination circuit 146. The main-down combination circuit 145 includes an encoder 147. The main-down combination circuit 145 encodes the first storage signals (EY1 to EYn) to output a fifth encoding signal (EKY), or encodes the third storage signals (DY1 to DYn) to output a fifth decoding signal (DKY).

The encoder 147 encodes the third error detection and correction information (EUP1) along with the fifth encoding signal (EKY) in response to the first error determination signal (ERR1) when the first error determination signal (ERR1) is enabled. Consequently, the main-down combination circuit 145 outputs the fifth encoding signal (EKY) including the third error detection and correction information (EUP1). Furthermore, the encoder 147 encodes the fourth error detection and correction information (EUP2) along with the fifth decoding signal (DKY) in response to the second error determination signal (ERR2) when the second error determination signal (ERR2) is enabled. Consequently, the main-down combination circuit 145 outputs the fifth decoding signal (DKY) including the fourth error detection and correction information (EUP2).

The sub-down combination circuit 146 may also include an encoder 148. The sub-down combination circuit 146 encodes the second storage signals (EYC1 to EYCm) to output a sixth encoding signal (EJY), or encodes the fourth storage signals (DYC1 to DYCm) to output a sixth decoding signal (DJY). The encoder 148 encodes the third error detection and correction information (EUP1) along with the sixth encoding signal (EJY) in response to the first error determination signal (ERR1) when the first error determination signal (ERR1) is enabled. Consequently, the sub-down combination circuit 146 outputs the sixth encoding signal (EJY) including the third error detection and correction information (EUP1). Furthermore, the encoder 148 encodes the fourth error detection and correction information (EUP2) along with the sixth decoding signal (DJY) in response to the second error determination signal (ERR2) when the second error determination signal (ERR2) is enabled. As a result, the sub-down combination circuit 146 outputs the sixth decoding signal (DJY) including the fourth error detection and correction information (EUP2).

The first multiplexer unit 240 multiplexes the third encoding signal (EK) and the fifth encoding signal (EKY) to output a first multiplex signal (EMX1), or multiplexes the third decoding signal (DK) and the fifth decoding signal (DKY) to output a second multiplex signal (DMX1).

The first multiplex signal (EMX1) can be one of the encoded read data signal (EODAT), the encoded state information (ESTATS) and the encoded chip information (ECONF). Furthermore, the second multiplex signal (DMX1) can be one of the decoded input data signal (DIDAT), the decoded command signal (DCOM), the decoded write address signal (DADR1) and the decoded read address signal (DADR2). The second multiplexer unit 250 multiplexes the fourth encoding signal (EJ) and the sixth encoding signal (EJY) to output the third multiplex signal (EMX2), or multiplexes the fourth decoding signal (DJ) and the sixth decoding signal (DJY) to output the fourth multiplex signal (DMX2).

The first error check unit 260 detects and corrects error of the first and second storage signals (EY1 to EYn and EYC1 to EYCm) to output the first error detection and correction information (EDN1), or detects and corrects error of the third and fourth storage signals (DY1 to DYn and DYC1 to DYCm) to output the second error detection and correction information (EDN2). The second error check unit 270 detects and corrects error of the first and third multiplex signals (EMX1, EMX2) to output the third error detection and correction information (EUP1), or detects and corrects error of the second and fourth multiplex signals (DMX1, DMX2) to output the fourth error detection and correction information (EUP2).

The error compare unit 280 compares the first and third error detection and correction information (EDN1, EUP1) and generates the first error determination signal (ERR1) according to the comparison result. More particularly, when the first and third error detection and correction information (EDN1, EUP1) is identical to each other, the error compare unit 280 disables the first error determination signal (ERR1). Meanwhile, when the first and third error detection and correction information (EDN1, EUP1) is not identical to each other, the error compare unit 280 enables the first error determination signal (ERR1). At the same time, the error compare unit 280 outputs the first error detection and correction information (EDN1) to the encoders 213, 214, and outputs the third error detection and correction information (EUP1) to the encoders 143, 144, 147 and 148.

Furthermore, the error compare unit 280 compares the second and fourth error detection and correction information (EDN2, EUP2), and generates the second error determination signal (ERR2) according to the comparison result. More particularly, when the second and fourth error detection and correction information (EDN2, EUP2) is identical to each other, the error compare unit 280 disables the second error determination signal (ERR2). Meanwhile, when the second and fourth error detection and correction information (EDN2, EUP2) is not identical to each other, the error compare unit 280 enables the second error determination signal (ERR2). At the same time, the error compare unit 280 outputs the second error detection and correction information (EDN2) to the encoders 213, 214 and outputs the third error detection and correction information (EUP2) to the encoders 143, 144, 147 and 148. As described above, in the flash memory device 101, the FSM check unit 200 performs the encoding or decoding operation and the error detection and correction operation at the same time. This can reduce an access time of the flash memory device 101.

As described above, a flash memory device executes an error detection and correction operation while encoding or decoding transmission and reception signals with a host apparatus. A design algorithm can be simplified, an access time can be shortened and the performance of an overall system including a flash memory device can be improved.

Although the foregoing description has been made with reference to the various embodiments, it is to be understood that changes and modifications may be made by the ordinary skilled in the art without departing from the spirit and scope of the present invention defined by the appended claims.

What is claimed as new and desired to be protected by Letters Patent of the United States is:

1. A flash memory device, comprising:
   a Finite State Machine (FSM) check unit, which detects and corrects error of an input data signal, a command signal, a write address signal and a read address signal, while decoding any one of the signals, to output one of a decoded input data signal, a decoded command signal, a decoded write address signal and a decoded read address signal, and detects and corrects error of a read data signal, state information and chip information, while encoding one of the read data signal, the state information and the chip information, to output one of an encoded read data signal, encoded state information and encoded chip information; and
   a flash memory core, which stores the decoded input data signal in response to the decoded command signal and the decoded write address signal, outputs the read data signal in response to the decoded command signal and the decoded read address signal, and outputs the state information and the chip information in response to a control signal.

2. The flash memory device as claimed in claim 1, further comprising:
   a control logic unit that outputs the control signal in response to a control information signal; and
   a host interface unit that interfaces the control logic unit, the FSM check unit, and an external host apparatus.

3. The flash memory device as claimed in claim 2, wherein the host interface unit extracts the input data signal, the command signal and the write address signal or the read address signal from a first transmission signal received from the host apparatus to output the input data signal to the control logic unit and the command signal and the write or read address signal to the FSM check unit, and extracts the control information signal from a second transmission signal received from the host apparatus to output the extracted signal to the control logic unit, and
   the control logic unit outputs the input data signal to the FSM check unit and outputs the control signal and additional control signals in response to the control information signal.

4. The flash memory device as claimed in claim 2, wherein the host interface unit converts the encoded read data signal into a third transmission signal and outputs the converted result to the host apparatus, and converts the encoded state information and the encoded chip information into a fourth transmission signal and outputs the converted result to the host apparatus, and
   the control logic unit outputs the encoded read data signal, which is received from the FSM check unit, to the host interface unit.

5. The flash memory device as claimed in claim 1, wherein the FSM check unit comprises:
   a first combination circuit which encodes or decodes an input signal, and outputs first encoding signals and second encoding signals or first decoding signals and second decoding signals;
   a register circuit which stores the first and second encoding signals and outputs first and second storage signals or stores the first and second decoding signals and outputs third and fourth storage signals, in response to a clock signal;
   a second combination circuit, which encodes or decodes the input signals to output third and fourth encoding signals or third and fourth decoding signals, encodes the first and second storage signals to output fifth and sixth encoding signals, or decodes the third and fourth storage signals to output fifth and sixth decoding signals;
   a first multiplexer unit which multiplexes the third encoding signal and the fifth encoding signal to output a first multiplex signal or multiplexes the third decoding signal and the fifth decoding signal to output a second multiplex signal;
   a second multiplexer unit which multiplexes the fourth encoding signal and the sixth encoding signal to output a third multiplex signal or multiplexes the fourth decoding signal and the sixth decoding signal to output a fourth multiplex signal;
   a first error check unit which detects and corrects error of the first and second storage signals, outputs first error detection and correction information, or detects and corrects error of the third and fourth storage signals and outputs second error detection and correction information;
   a second error check unit which detects and corrects error of the first multiplex signal and the third multiplex signal and outputs third error detection and correction information, or detects and corrects error of the second multiplex signal and the fourth multiplex signal and outputs fourth error detection and correction information; and
   an error compare unit which compares the first error detection and correction information and the third error detection and correction information and generates a first error determination signal according to the comparison result, or compares the second error detection and correction information and the fourth error detection and correction information and generates a second error determination signal according to the comparison result.

6. The flash memory device as claimed in claim 5, wherein the error compare unit disables the first error determination signal when the first error detection and correction information and the third error detection and correction information are identical to each other and enables the first error determination signal when the first error detection and correction information and the third error detection and correction information are not identical to each other, and at the same time outputs first and third error detection and correction information, and disables the second error determination signal when the second error detection and correction information and the fourth error detection and correction information are identical to each other and enables the second error determination signal when the second error detection and correction information and the fourth error detection and correction information are not identical to each other, and at the same time, outputs the second and fourth error detection and correction information.

7. The flash memory device as claimed in claim 6, wherein the input signal is one of the input data signal, the command signal, the write address signal, and the read address signal, or one of the read data signal, the state information and the chip information,
the first multiplex signal is one of the encoded read data signal, the encoded state information and the encoded chip information, and the second multiplex signal is one of the decoded input data signal, the decoded command signal, the decoded write address signal and the decoded read address signal.

8. The flash memory device as claimed in claim 6, wherein the first combination circuit comprises:
a main combination circuit that encodes or decodes the input signal and outputs the first encoding signals or the first decoding signals; and
a sub combination circuit that encodes or decodes the input signal and outputs the second encoding signals or the second decoding signals.

9. The flash memory device as claimed in claim 8, wherein the main combination circuit includes a first encoder which encodes the first error detection and correction information along with the first encoding signals in response to the first error determination signal and outputs the encoded result, or encodes the second error detection and correction information along with the first decoding signals in response to the second error determination signal and outputs the encoded result, and
the sub-combination circuit includes a second encoder which encodes the first error detection and correction information along with the second encoding signals in response to the first error determination signal and outputs the encoded result, or encodes the second error detection and correction information along with the second decoding signals in response to the second error determination signal and outputs the encoded result.

10. The flash memory device as claimed in claim 6, wherein the register circuit comprises:
a first register unit including first registers which store the first encoding signals, respectively, and output the first storage signals, respectively, or store the first decoding signals, respectively, and output the third storage signals, in response to the clock signal; and
a second register unit including second registers which store the second encoding signals, respectively, and output the second storage signals, respectively, or store the second decoding signals, respectively, and output the fourth storage signals, in response to the clock signal.

11. The flash memory device as claimed in claim 6, wherein the second combination circuit comprises:
an up combination circuit unit that encodes or decodes the input signals to output the third and fourth encoding signals or the third and fourth decoding signals; and
a down combination circuit unit which encodes the first and second storage signals to output fifth and sixth encoding signals, or encodes the third and fourth storage signals to output fifth and sixth decoding signals.

12. The flash memory device as claimed in claim 11, wherein the up combination circuit unit comprises:
a main-up combination circuit that encodes the input signals to output the third encoding signal or decodes the input signals to output the third decoding signal; and
a sub-up combination circuit that encodes the input signals to output the fourth encoding signal or decodes the input signals to output the fourth decoding signal.

13. The flash memory device as claimed in claim 12, wherein the main-up combination circuit includes a first encoder, which encodes the third error detection and correction information along with the third encoding signal and outputs the encoding result, in response to the first error determination signal, or encodes the fourth error detection and correction information along with the third decoding signal and outputs the encoding result, in response to the second error determination signal, and
the sub-up combination circuit includes a second encoder, which encodes the third error detection and correction information along with the fourth encoding signal and outputs the encoding result, in response to the first error determination signal, or encodes the fourth error detection and correction information along with the fourth decoding signal and outputs the encoding result, in response to the second error determination signal.

14. The flash memory device as claimed in claim 11, wherein the down combination circuit unit comprises:
a main-down combination circuit that encodes the first storage signals to output the fifth encoding signal or decodes the third storage signals to output the fifth decoding signal; and
a sub-down combination circuit that encodes the second storage signals to output the sixth encoding signal or decodes the fourth storage signals to output the sixth decoding signal.

15. The flash memory device as claimed in claim 14, wherein the main-down combination circuit includes a first encoder which encodes the third error detection and correction information along with the fifth encoding signal and outputs the encoding result, in response to the first error determination signal, or encodes the fourth error detection and correction information along with the fifth decoding signal and outputs the encoding result, in response to the second error determination signal, and
the sub-down combination circuit includes a second encoder which encodes the third error detection and correction information along with the sixth encoding signal and outputs the encoding result, in response to the first error determination signal, or encodes the fourth error detection and correction information along with the sixth decoding signal and outputs the encoding result in response to the second error determination signal.

* * * * *